(12) United States Patent
Friedman et al.

(10) Patent No.: US 8,222,936 B2
(45) Date of Patent: Jul. 17, 2012

(54) PHASE AND FREQUENCY DETECTOR WITH OUTPUT PROPORTIONAL TO FREQUENCY DIFFERENCE

(75) Inventors: Daniel J. Friedman, Sleepy Hollow, NY (US); Alexander V. Rylyakov, Mount Kisco, NY (US); José A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 12/813,828

(22) Filed: Jun. 11, 2010

(65) Prior Publication Data

US 2011/0063003 A1    Mar. 17, 2011

Related U.S. Application Data

(60) Provisional application No. 61/241,938, filed on Sep. 13, 2009.

(51) Int. Cl.
*H03L 7/06* (2006.01)
(52) U.S. Cl. ......................................... 327/157; 327/148
(58) Field of Classification Search .................. 327/148, 327/157
See application file for complete search history.

(56) References Cited

U.S. PATENT DOCUMENTS

| | | | |
|---|---|---|---|
| 4,191,975 A | 3/1980 | White et al. | |
| 6,236,343 B1 | 5/2001 | Patapoutian | |
| 6,933,791 B2 | 8/2005 | Chen | |
| 7,132,898 B2 | 11/2006 | Lin | |
| 7,221,201 B2 | 5/2007 | Lin et al. | |
| 7,283,602 B2* | 10/2007 | Takasoh | 375/376 |
| 7,362,151 B2 | 4/2008 | de la Torre | |
| 7,864,911 B2* | 1/2011 | Chatwin | 375/375 |
| 7,957,500 B2* | 6/2011 | Sanduleanu et al. | 375/374 |
| 2004/0061539 A1* | 4/2004 | Joordens et al. | 327/165 |
| 2004/0114702 A1* | 6/2004 | Friedman et al. | 375/373 |
| 2007/0096836 A1* | 5/2007 | Lee et al. | 331/57 |
| 2007/0194819 A1 | 8/2007 | Krasser et al. | |
| 2008/0169849 A1 | 7/2008 | Chatwin | |
| 2008/0238489 A1* | 10/2008 | Sanduleanu et al. | 327/42 |
| 2008/0265957 A1* | 10/2008 | Luong et al. | 327/156 |
| 2008/0284464 A1* | 11/2008 | Bucossi et al. | 326/26 |
| 2009/0110136 A1* | 4/2009 | Badalone | 375/376 |
| 2010/0205488 A1* | 8/2010 | Sanduleanu et al. | 714/700 |
| 2010/0295586 A1* | 11/2010 | Weiner | 327/157 |
| 2011/0063003 A1* | 3/2011 | Friedman et al. | 327/157 |

OTHER PUBLICATIONS

Disclosed Anonymously, "A Bang-Bang Phase Detector with Improved DC Immunity," IPCOM000135340D, www.ip.com, Apr. 2006, 3 pages.

(Continued)

*Primary Examiner* — Lincoln Donovan
*Assistant Examiner* — Adam Houston
(74) *Attorney, Agent, or Firm* — Anne V. Dougherty; Ryan, Mason & Lewis, LLP

(57) ABSTRACT

Phase and frequency detectors and techniques are disclosed. For example, apparatus comprises a first circuit for receiving first and second clock signals and for generating at least one signal indicative of a phase difference between the first and second clock signals. The apparatus also comprises a second circuit for receiving the at least one signal generated by the first circuit and, in response to the at least one received signal, generating at least one output signal, wherein a frequency associated with the at least one output signal is proportional to a frequency difference between the first and second clock signals.

25 Claims, 11 Drawing Sheets

OTHER PUBLICATIONS

Disclosed Anonymously, "Method for a Programmable Fractional Multiplier PLL Clock Generation," IPCOM000008415D, www.ip.com, Jun. 2002, 4 pages.

Disclosed Anonymously, "Method for Synchronizing High-Frequency Outputs of Multiple Integrated On-Chip PLLs by Means of Phase-Detection Shadowing," IPCOM000009101D, www.ip.com, Aug. 2002, 5 pages.

* cited by examiner

100

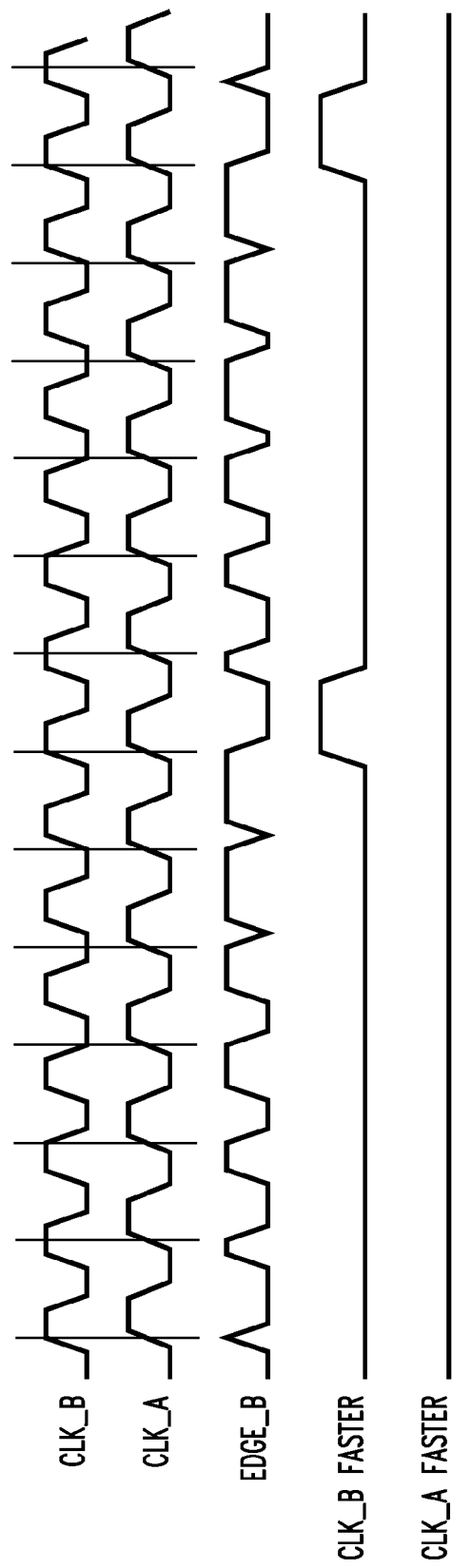

200'

400

600

800

900

PHASE AND FREQUENCY DETECTOR WITH OUTPUT PROPORTIONAL TO FREQUENCY DIFFERENCE

CROSS REFERENCE TO RELATED APPLICATION

The present application claims priority to U.S. Provisional Application Ser. No. 61/241,938 filed on Sep. 13, 2009 and entitled "Phase and Frequency Detector," the disclosure of which is incorporated by reference herein in its entirety.

FIELD OF THE INVENTION

The present invention relates generally to phase and frequency detectors and, more specifically, to phase and frequency detectors which generate an output signal proportional to a frequency difference between two input signals.

BACKGROUND OF THE INVENTION

As is known, a phase detector is a device that measures the phase difference between two periodic input signals of the same frequency. A bang-bang phase detector is a variant of the phase detector, where the output of the detector merely indicates which of the two input signals arrived earlier in time.

As is also known, a phase and frequency detector (PFD) is a device that measures the phase difference between two periodic input signals when the two input signal are not of the same frequency.

It is also known that phase detectors and PFDs are typically used in phase locked loops (PLL) or delay locked loops (DLL) to generate an error signal that is used by a filter inside a loop.

SUMMARY OF THE INVENTION

Principles of the invention provide phase and frequency detectors and techniques for generating an output signal proportional to a frequency difference between two input signals.

In accordance with one embodiment of the invention, apparatus comprises a first circuit for receiving first and second clock signals and for generating at least one signal indicative of a phase difference between the first and second clock signals. The apparatus also comprises a second circuit for receiving the at least one signal generated by the first circuit and, in response to the at least one received signal, generating at least one output signal, wherein a frequency associated with the at least one output signal is proportional to a frequency difference between the first and second clock signals.

These and other features, objects and advantages of the present invention will become apparent from the following detailed description of illustrative embodiments thereof, which is to be read in connection with the accompanying drawings.

BRIEF DESCRIPTION OF THE DRAWINGS

FIG. 2B illustrates a timing diagram for the detector of FIG. 2A.

DETAILED DESCRIPTION OF PREFERRED EMBODIMENTS

Note that while certain illustrative embodiments are described below as being implemented in digital circuitry, it is understood that one or more of the components can alternatively be implemented in software. Further, certain embodiments may be implemented with one or more of analog circuit components.

Furthermore, while the illustrative embodiments are described herein as being applicable to phase locked loop (PLL) applications, it is to be appreciated that the phase and frequency detection principles of the invention can be applied to other suitable applications. Still further, the phase and frequency detection principles of the invention may be implemented in a wide variety of operating environments.

For example, but not limited thereto, the phase and frequency detection principles of the invention may be implemented in a PLL used in a multi-core processor device. That is, it is realized that while modern microprocessors have the ability to trade-off power and performance by changing their clock frequency under software control, existing mechanisms for doing so in fine frequency increments, and while user code is running on the processor, tend to use a prohibitive amount of integrated circuit space, and are limited in the rate at which the frequency can change. Advantageously, use of the phase and frequency detection principles of the invention in a PLL application permit for a mechanism that can provide a variable frequency to each core of a multi-core processor in an effective manner. However, it is to be understood that the phase and frequency detection principles of the invention may be applied to operating environments other than microprocessors.

Figure 1:
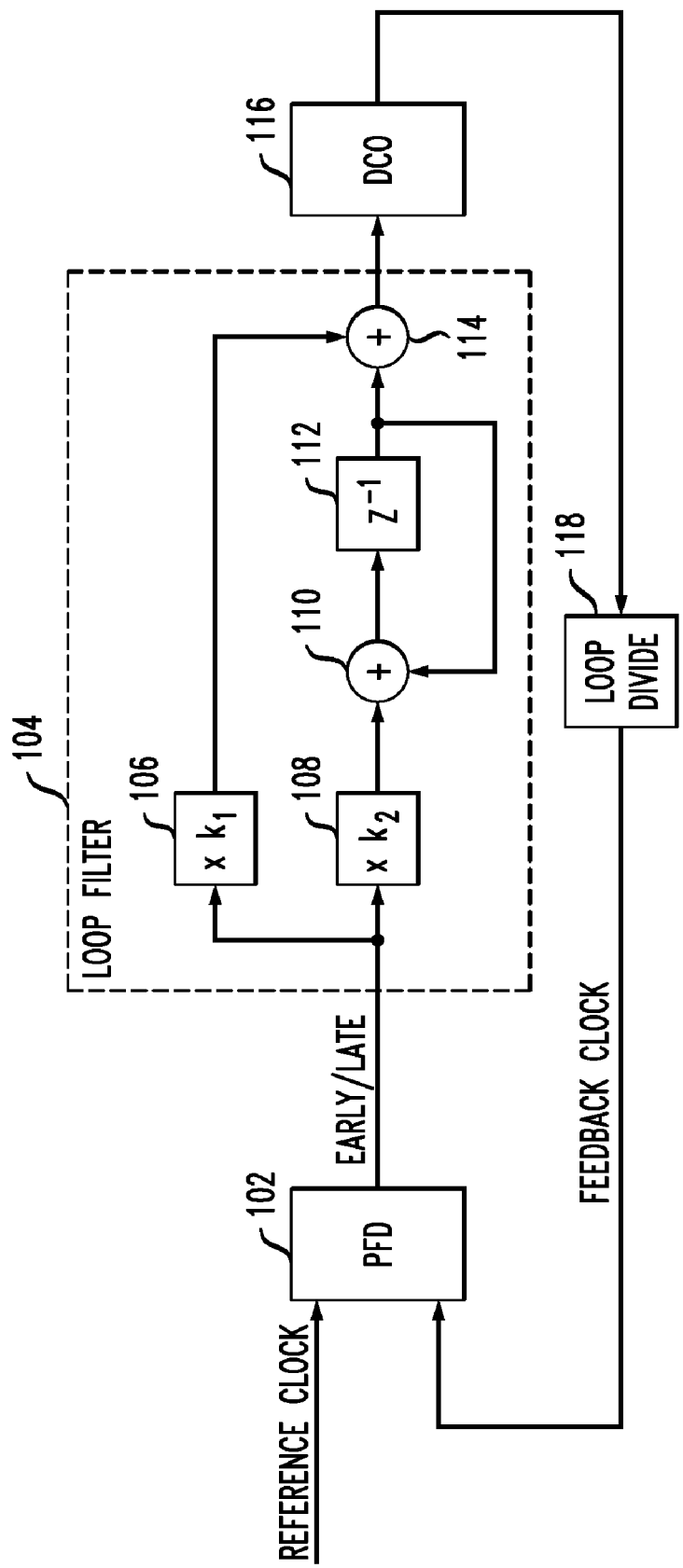
FIG. 1 illustrates a phase locked loop according to an embodiment of the invention.

FIG. 1 illustrates a PLL application of a phase and frequency detector (PFDs). As shown, a loop circuit 100 comprises a PFD 102, a loop filter 104, a digitally-controlled oscillator (DCO) 116 and a loop divider 118. The loop filter 104 comprises a first gain constant ($k_1$) multiplier 106, a second gain constant ($k_2$) multiplier 108, a first adder 110 and a unit delay element 112 (forming an integrator), and a second adder 114.

The PFD 102 compares a reference clock signal and a feedback clock signal and produces an error signal which is proportional to the phase difference between the two input clock signals. The phase difference associated with the error signal is indicative of which input signal is ahead in phase (early) or behind in phase (late) with respect to the other input signal. Thus, the detector operates as a bang-bang type detector. The error signal is then input to the loop filter 104 whose output then drives DCO 116. DCO 116 generates an output clock signal at a particular frequency. The output clock signal is fed through the loop divider 118 generating the feedback clock signal (and forming a negative feedback loop). If the output frequency drifts, the error signal will increase, driving the DCO frequency in the opposite direction so as to reduce the error. Thus, the output signal from DCO is locked to the frequency of the reference clock signal. This reference clock signal can be derived from a crystal oscillator, which tends to be stable in frequency.

The loop filter 104 operates as follows. The phase detector output signal (phase error) is multiplied by the first gain constant $k_1$, which is known as the proportional gain constant. The result of the multiplication is fed into the second adder 114. The phase detector output signal (phase error) is also multiplied by the second gain constant $k_2$, which is known as the integral gain constant. The result of this second multiplication is fed into an integrator comprising the first adder 110 and a unit delay 112 (e.g., register). The output signal of the integrator is fed into the second adder 114. The output of the second adder 114 (and thus the loop filter 104) is the sum of the product of the proportional gain constant and the phase error computed in the multiplier 106 and the output of the integrator.

There are many constraints imposed on the loop filter. One of them is the basic trade-off between how damped the closed system is, and how quickly it reacts to its inputs. For example, in FIG. 1, it is desirable to make constant $k_2$ as large as possible for the system to react quickly; but if it is too large, the closed loop will be unstable and not operate as desired.

Illustrative principles of the invention address and solve this problem, as well as other problems. It is to be appreciated that while illustrative embodiments described below are implemented in terms of a bang-bang type PFD, the inventive principles can be applied in a straightforward manner to a linear type PFD.

In one embodiment, the phase and frequency detection principles of the invention generate a signal that is proportional to the difference in frequency between the reference clock and feedback clock. An example of a circuit for generating the signal proportional to the difference in frequency between the reference clock and feedback clock is shown in FIG. 2A.

Figure 2A:
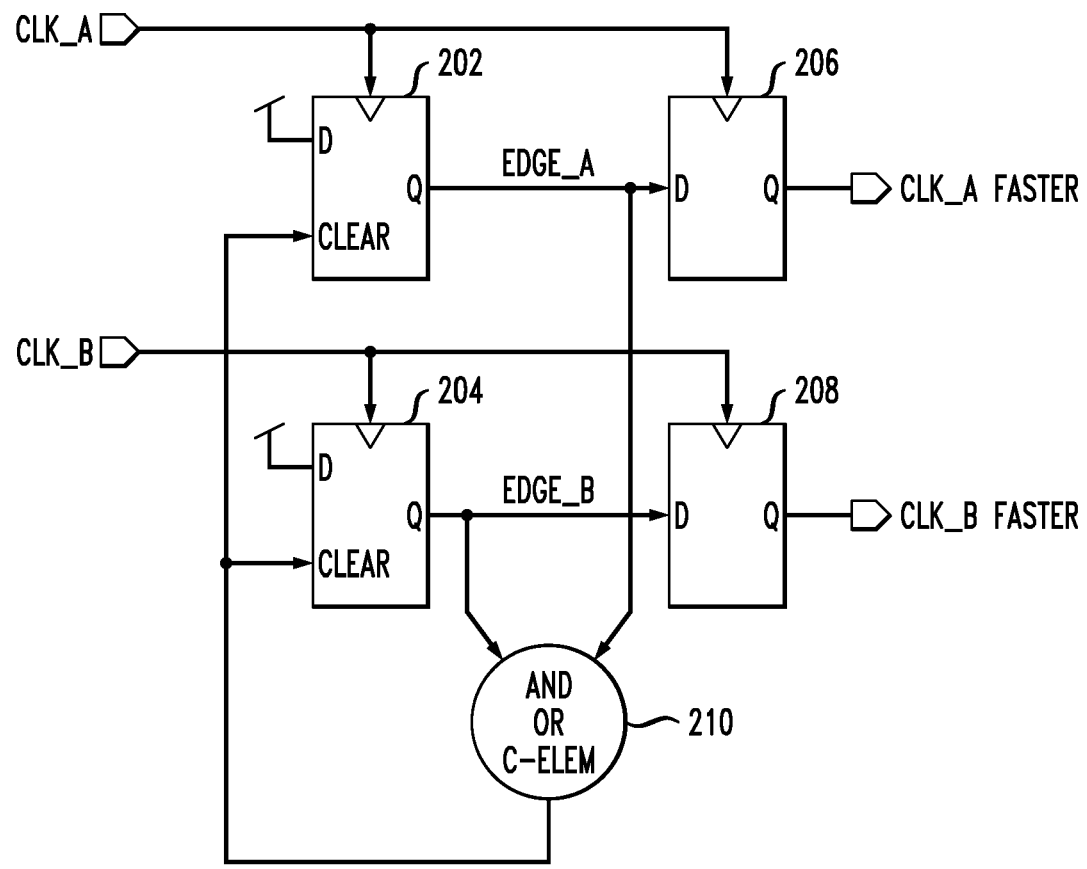
FIG. 2A illustrates a frequency-proportional detector according to an embodiment of the invention.

The frequency-proportional detector circuit 200 in FIG. 2A comprises a first edge-detector latch (DQ flip-flop) 202, a second edge-detector latch (DQ flip-flop) 204, a first output latch (DQ flip-flop) 206, a second output latch (DQ flip-flop) 208 and an AND gate 210. The function of the AND gate can alternatively be provided by a C-element (a Muller C-gate).

As shown, clock signals Clk_A and Clk_B arrive at the edge-detector latches 202 and 204, respectively. The edge-detector latches may be implemented as a traditional bang-bang PFD or as a proportional PFD. That is, in a bang-bang implementation, the edge-detector latches 202 and 204 generate logic pulses (based on the phase error between the two input clock signals) with a fixed charge; while in a proportional implementation, the charges of the logic pulses are in proportion to the phase error detected. The AND gate clears the DQ flip-flops based on the state of the Q outputs.

In accordance with this embodiment, the outputs of the edge-detector latches, Edge_A and Edge_B, are then resampled by the two output latches 206 and 208 to generate signals Clk_A Faster and Clk_B Faster, respectively. In a lock state or condition, both of these signals will be a logic-low level, as Edge_A and Edge_B are a logic-low level before the respective clock arrives. When the circuit is out-of-lock state or condition, however, a rising edge in Clk_A will find Edge_A at a logic-high level when Clk_A gains a cycle relative to Clk_B (no reset pulse gets generated in between two Clk_A transitions). Clk_A Faster will be a logic-high level on every Clk_A rising edge that Clk_A gains a cycle with respect to Clk_B. The converse is true for Clk_B Faster, i.e., Clk_B Faster will be a logic-high level on every Clk_B rising edge that Clk_B gains a cycle with respect to Clk_A. Because a pulse is generated every time that a cycle is gained, at constant Clk_A and Clk_B frequencies, the frequency of the "Faster" pulses (outputs of latches 206 and 208) will be proportional to the difference between the frequencies of Clk_A and Clk_B. An exemplary timing diagram for the frequency-proportional detector circuit 200 is shown in FIG. 2B.

Figure 3A:
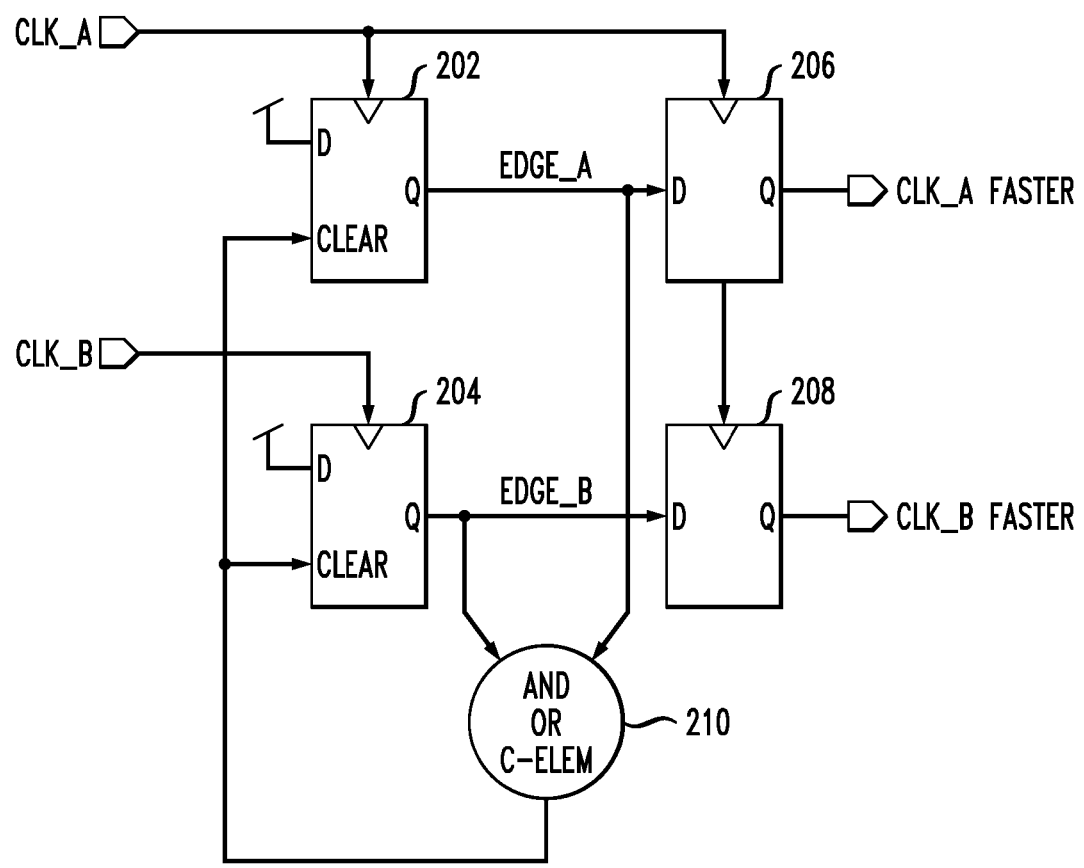
FIG. 3A illustrates a frequency-proportional detector according to another embodiment of the invention.
Figure 3B:
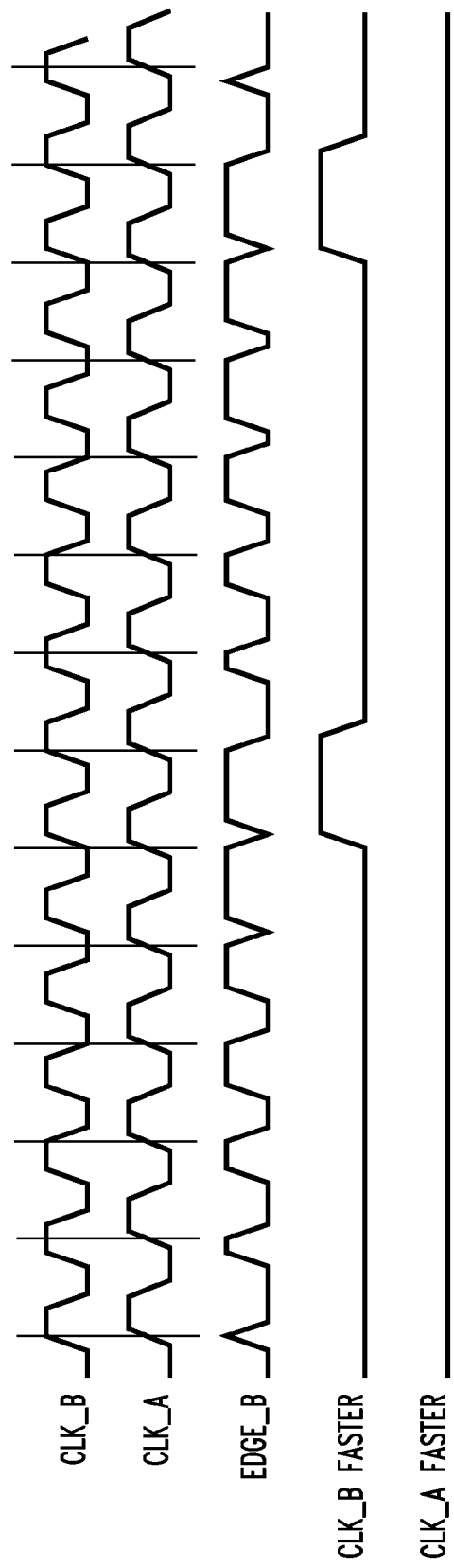
FIG. 3B illustrates a timing diagram for the detector of FIG. 3A.

One illustrative variant of this circuit is shown in the embodiment of FIG. 3A. In the frequency-proportional detector circuit 200' shown in this alternate embodiment, the output of both edge-detector latches 202 and 204 is captured by Clk_A. That is, Clk_A is used as the clock signal for both output latches 206 and 208 (as opposed to the embodiment of FIG. 2A where latch 208 is controlled by Clk_B). Once both "Faster" signals (Clk_A Faster and Clk_B Faster) are synchronized to Clk_A, they can be used in a digital implementation of the loop filter (assuming that the loop filter is running off Clk_A). An exemplary timing diagram for the frequency-proportional detector circuit 200' is shown in FIG. 3B.

Figure 4:
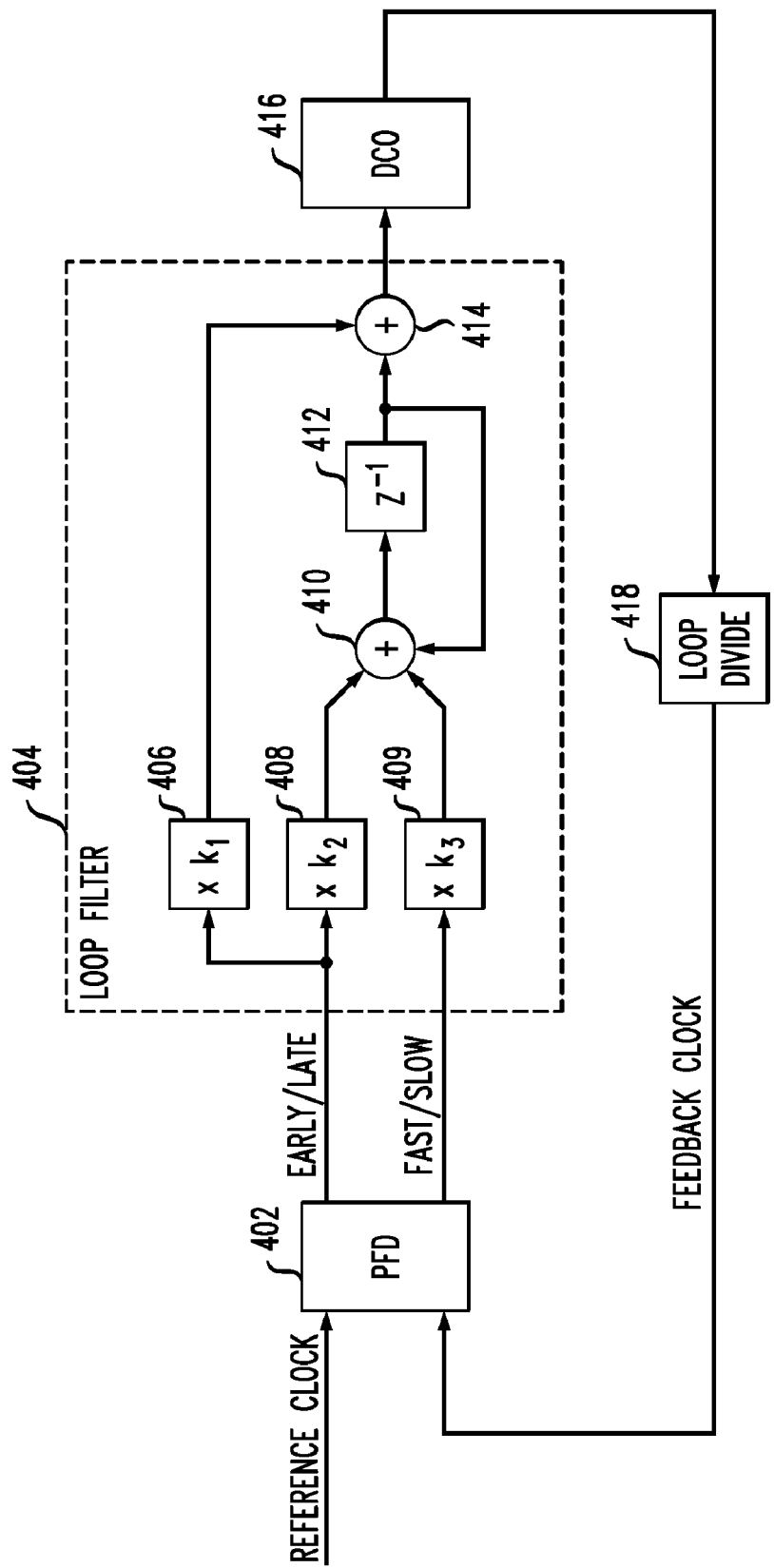
FIG. 4 illustrates a phase locked loop according to another embodiment of the invention.

FIG. 4 shows an illustrative embodiment of a PLL with a loop filter designed to take advantage of the "Faster" signals coming from the PFD (in this figure, marked as "Fast" and "Slow"). As shown, the loop circuit 400 comprises a PFD 402, a loop filter 404, a digitally-controlled oscillator (DCO) 416 and a loop divider 418. The loop filter 404 comprises a first gain constant ($k_1$) multiplier 406, a second gain constant ($k_2$) multiplier 408, a third gain constant ($k_3$) multiplier 409, a first adder 410 and a unit delay element 412 (forming an integrator), and a second adder 414.

The loop circuit 400 operates similar to the loop circuit 100 in FIG. 1 (where like numbered components offset by 300 have similar functions as described above, i.e., 102/402, 104/404 ... 118/418)) with the notable exception of the generation of the extra output signals by the PFD 402, i.e., Fast/Slow. These signals correspond to the "Faster" signals described above in the context of FIG. 3A (Clk_A Faster and Clk_B Faster). These signals are accumulated in the loop filter 404. Because the signals will never be asserted close to or in lock, parameter k3 can be made fairly large without affecting the stability of the PLL. The end result will be that this PLL in FIG. 4 will have substantially faster frequency acquisition time compared to the PLL in FIG. 1, and can be used where a fast frequency acquisition property is required. It is to be understood that, in this example, the stability of the loop depends on the ratio of k1 to k2, with typical values being on the order of 10 to 100. As this number grows, the system becomes more stable, but also slower. We can use a fairly small k1 to k3 ratio (1 or even less), that makes the system significantly faster without making it unstable.

Figure 5:
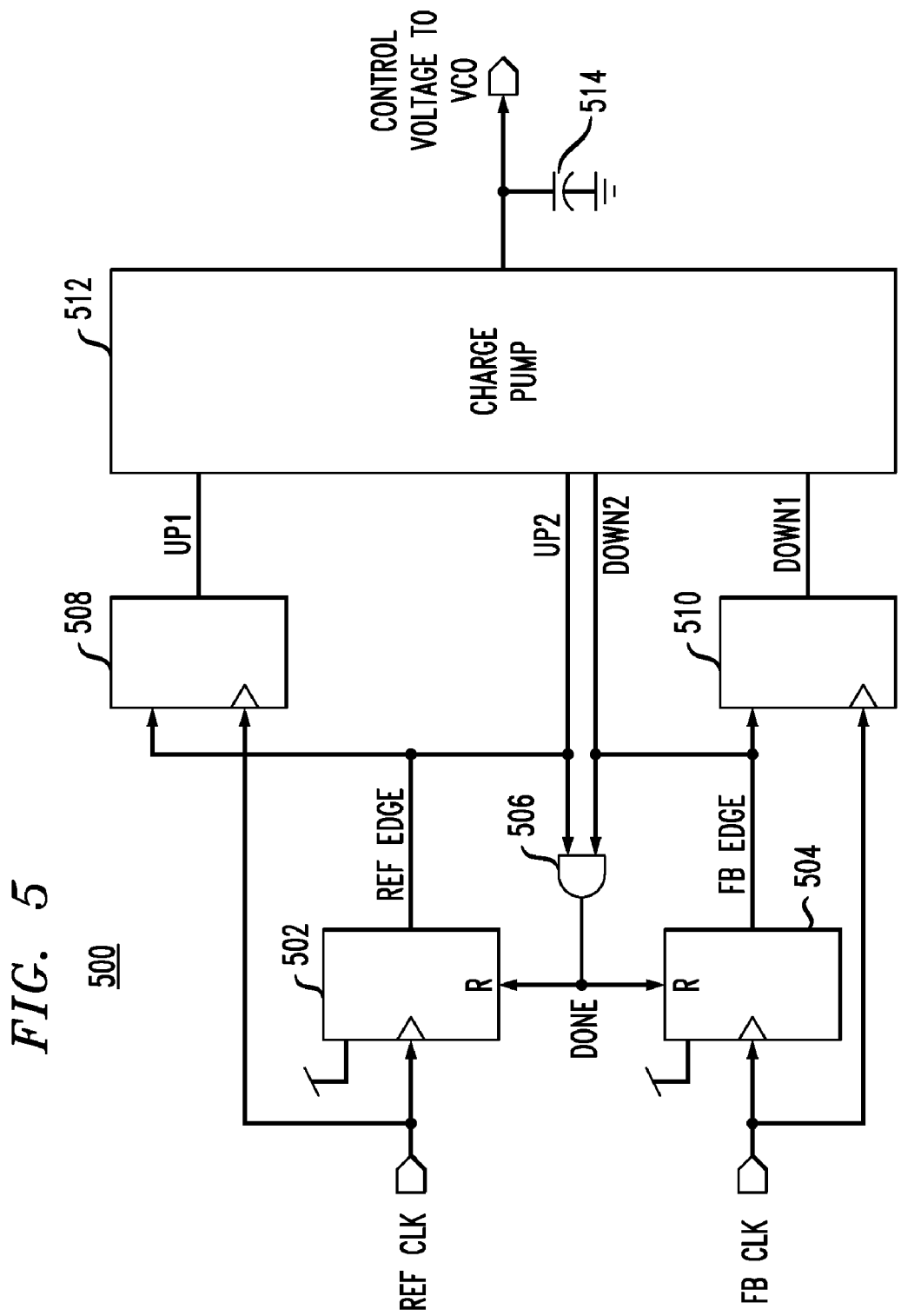
FIG. 5 illustrates a phase locked loop according to yet another embodiment of the invention.

The same detector can be used in a traditional linear analog PLL, with a linear PFD and a charge pump, as shown in FIG. 5. In the PLL circuit 500 in FIG. 5, the frequency proportional outputs can be used in the charge pump as extra inputs (Up1 and Down1), but would have a different gain from the PFD outputs (Up2 and Down2). For example, if a rising edge on Ref Clk arrives earlier than a rising edge on FB Clk, then the output of latch 502 is set to one, and the charge pump 512 increases the charge stored in capacitor 514 at a certain rate determined by the desired transfer of this circuit. When FB_Clk rising edge arrives, the output of latch 504 is set to one, then the output of AND gate 506 is set to one, and both latches 502 and 504 are reset to zero. At this point, no more charge is added to capacitor 514. If, however, a new edge on signal Ref_Clk arrives before a clearing rising edge arrives on FB_Clk, then latch 508 is set to one, and charge pump 512 starts charging capacitor 514 at an increased rate. This rate can be greatly increased relative to the rate when no second transition occurs without making the closed loop unstable. It is to be understood that the above example describes one case (rising edge on Ref Clk arrives earlier than a rising edge on FB Clk). However, given this description, one ordinarily skilled in the art will realize the straightforward operation of the other case (rising edge on FB Clk arrives earlier than a rising edge on Ref Clk).

Figure 6:
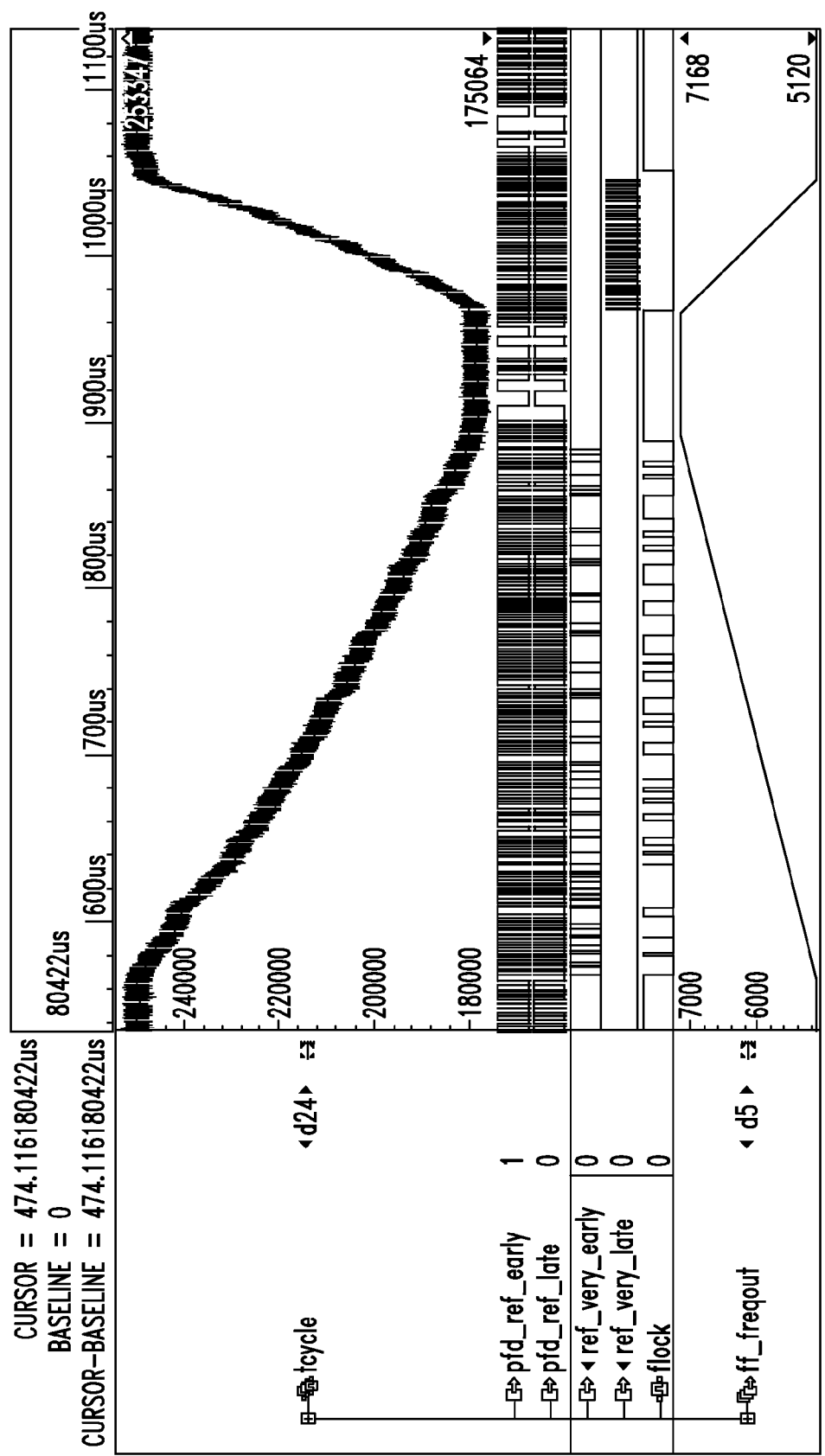
FIG. 6 illustrates a simulation result associated with a phase locked loop according to an embodiment of the invention.

In FIG. 6, a simulation is shown of a DPLL that uses phase and frequency detection principles of the invention. In this simulation 600, the PLL is forced to follow a very steep frequency ramp, first up in frequency and then down in frequency. Signals "ref_very_early" and "ref_very_late" are the signals generated in accordance with an illustrative embodiment of the invention (after synchronization to the loop filter clock). It can be seen how one of them helps the PLL follow the up ramp, while the other helps the PLL follow the down ramp. It is to be understood that signals "ref_very_early" and "ref_very_late" respectively refer to the Fast/Slow signals in FIG. 4.

Figure 7:
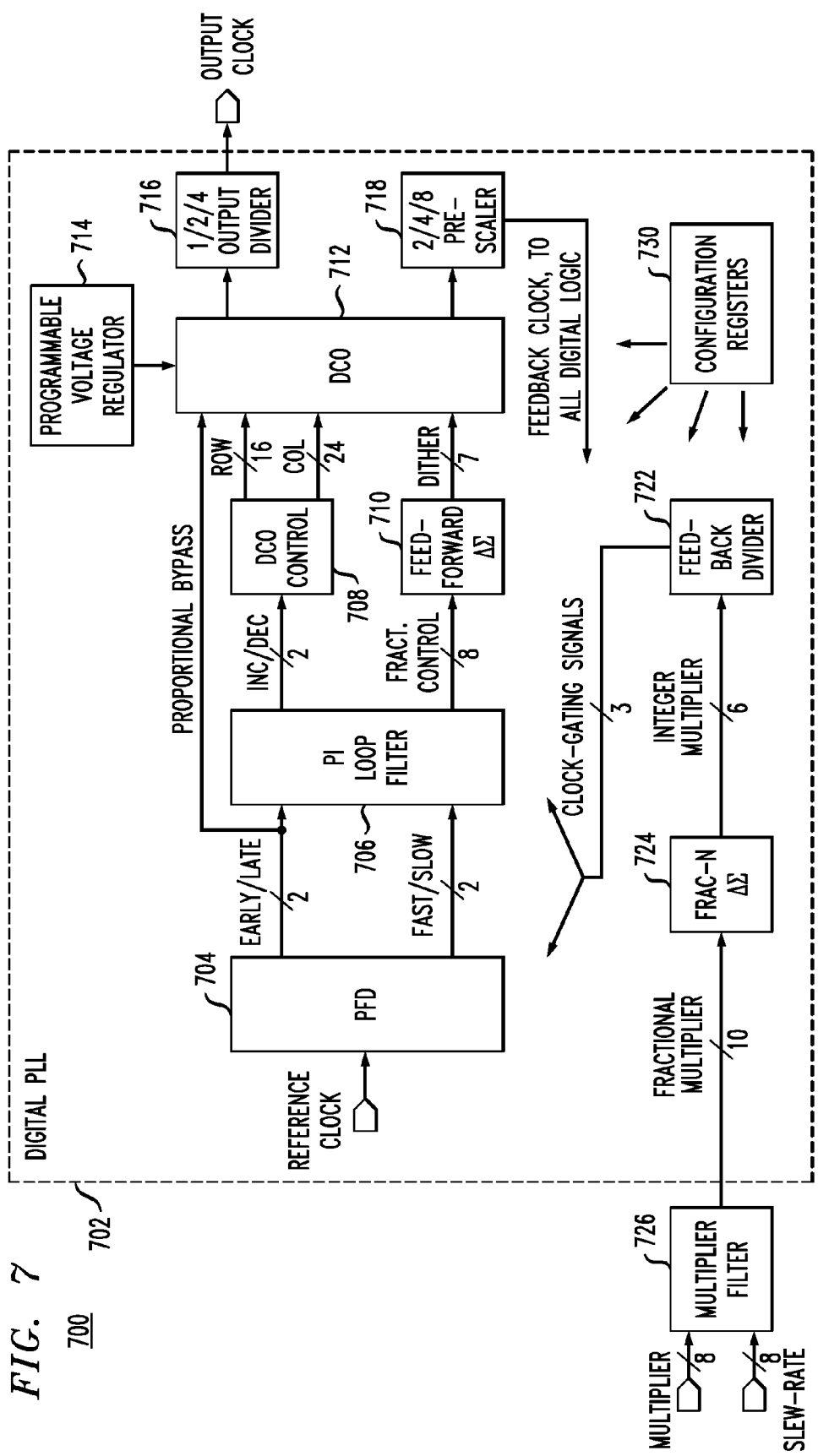
FIG. 7 illustrates a frequency generator according to an embodiment of the invention.

FIG. 7 shows a frequency generator 700, which is based on an all-digital PLL 702. A bang-bang, self-timed phase and frequency detector (PFD) 704 compares the reference clock to the divided down feedback clock, and generates two sets of signals. One set is the usual early/late information used to keep the DPLL phase locked. The second set, faster/slower, is a pulse stream whose intensity is proportional to the frequency difference between reference and feedback clocks. This pulse stream is generated, as explained above, in accordance with an embodiment of the invention. This signal is multiplied by a very large gain (see example explained above) in the frequency filter 706, and allows the DPLL 702 to achieve frequency lock very quickly, but is always de-asserted around phase lock, and therefore does not perturb the stability of the locked DPLL. The digital loop filter 706 is a programmable proportional-integral filter with a 12-bit accumulator, that is clocked by the divided down feedback clock.

Overflows and underflows from this 12-bit accumulator are used to increment or decrement the DCO frequency, set by the DCO control block 708. By asserting the faster/slower signals from the PFD 704, this forces an immediate overflow or underflow condition, thus creating a high-gain path into the DCO 712. The five most significant bits of the accumulator are sent to a $2^{nd}$ order $\Delta\Sigma$ encoder 710 running at a multiple of the loop filter frequency. The DCO 712 is a three stage ring oscillator, each stage of the ring including multiple tri-state inverters connected in parallel. Oscillation frequency is determined by how many inverters are turned on. These inverters are placed in an array, and controlled with a row-column pseudo-thermometer code. Two extra rows of inverters are used to implement frequency dithering, a loop filter bypass of the proportional path, and start-up.

The output of the DCO is divided down by 1, 2, or 4 by output divider 716 to generate the DPLL output clock. The output of the DCO is also divided down by 2, 4, or 8 (prescaler 718) before being used for all of the digital logic inside of the DPLL. Further divisions and clock phases are generated by the feedback divider 722 using "phase holds," or clock gating signals. A first-order $\Delta\Sigma$ encoder 724 transforms a 14-bit frequency multiplier word into a 6-bit integer multiplier word, to implement fractional-N frequency synthesis. This 14-bit frequency multiplier is generated by the multiplier filter 726. According to the mode of operation, the multiplier filter 726 will use both the target multiplier and slew rate to generate a frequency ramp, or use the output of the critical path monitor (CPM) filter to reach a CPM-optimized frequency. Note that the various operation controls described above may be programmed using configuration registers 720.

Figure 8:
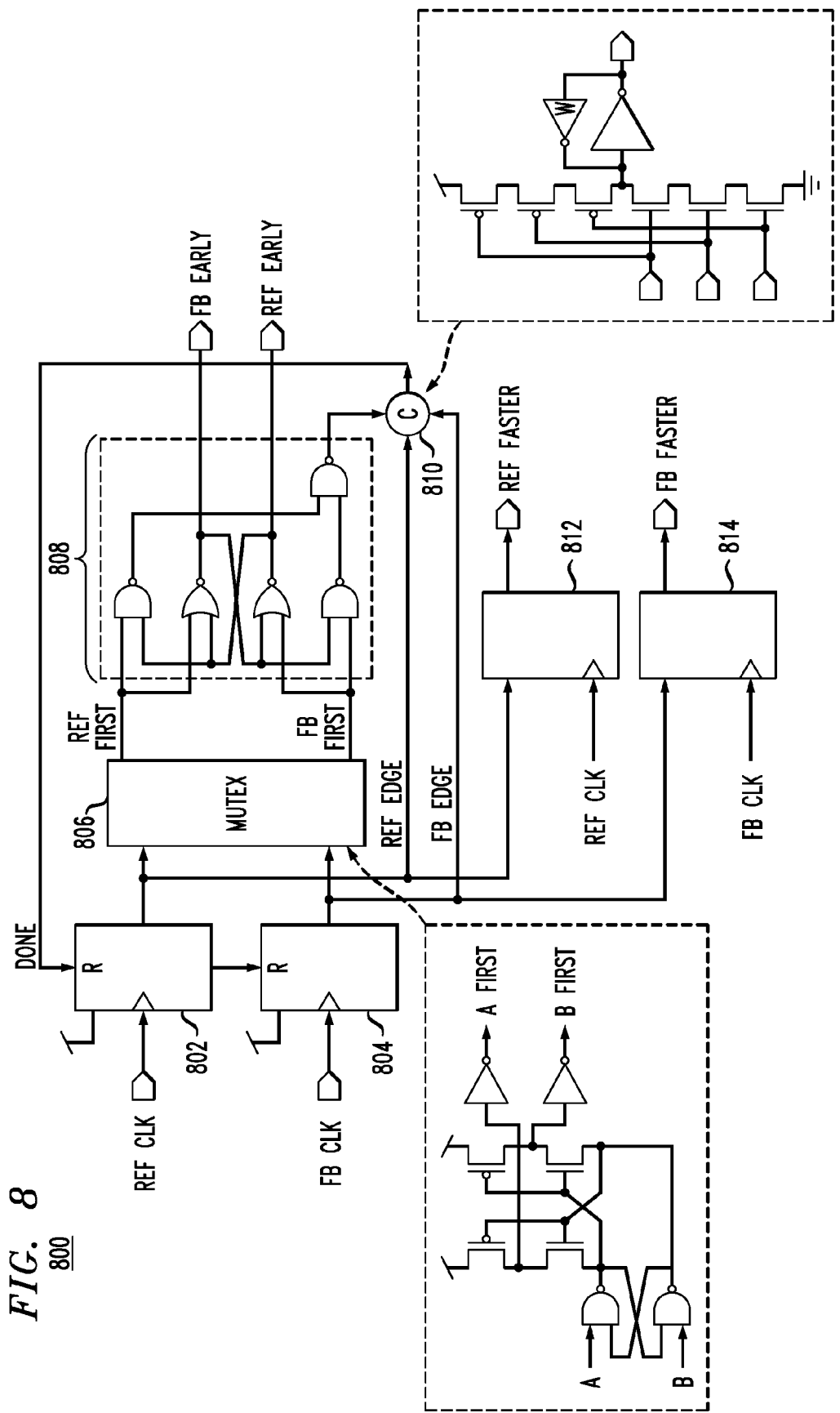
FIG. 8 illustrates a phase and frequency detector according to an embodiment of the invention.

A key feature of the design of FIG. 7 is the fast lock circuit 800, shown in FIG. 8, which allows the DPLL to track changes to the frequency multiplier. The fast lock circuit 800 corresponds to PFD 702 in FIG. 7. Edges on Ref Clk and FB Clk are detected by edge-detection latches 802 and 804, respectively, and passed through a mutual exclusion circuit (mutex) 806, to assert either Ref First or FB First, according to which edge happened first. The mutex 806 ensures that these two signals are not simultaneously asserted. A self-timed set-reset latch 808 stores the result of the arrival order. After both edges have arrived, and the output latch 808 is set, a done signal is generated by a three-input C-element 810, resetting the edge-detection latches 802 and 804 and priming the circuit 800 for a new pair of edges. Signals Ref Early and FB Early are stable until a new edge arrives, and are sampled for use by the loop filter (706 in FIG. 7).

When a cycle-slip occurs, two edges of one of the clocks arrive without an intervening edge of the other clock (one clock is now "one cycle ahead"). In this case, the second edge of the fast clock arrives when the corresponding edge-detector latch is still set, as "done" can only be generated after both clock edges have arrived. At this point, the corresponding "Faster" signal will be set, indicating which clock is running faster. The "Faster" signals, Ref Faster and FB Faster, are generated by latches 812 and 814, respectively. Because the "Faster" signals are asserted every time that a cycle-slip happens, they are asserted with a frequency that is proportional to the difference in frequency between the two clocks. Once the DPLL (702 in FIG. 7) is locked, the two clock frequencies are the same, and the "Faster" signals are de-asserted until the DPLL 702 goes out of lock.

Figure 9:
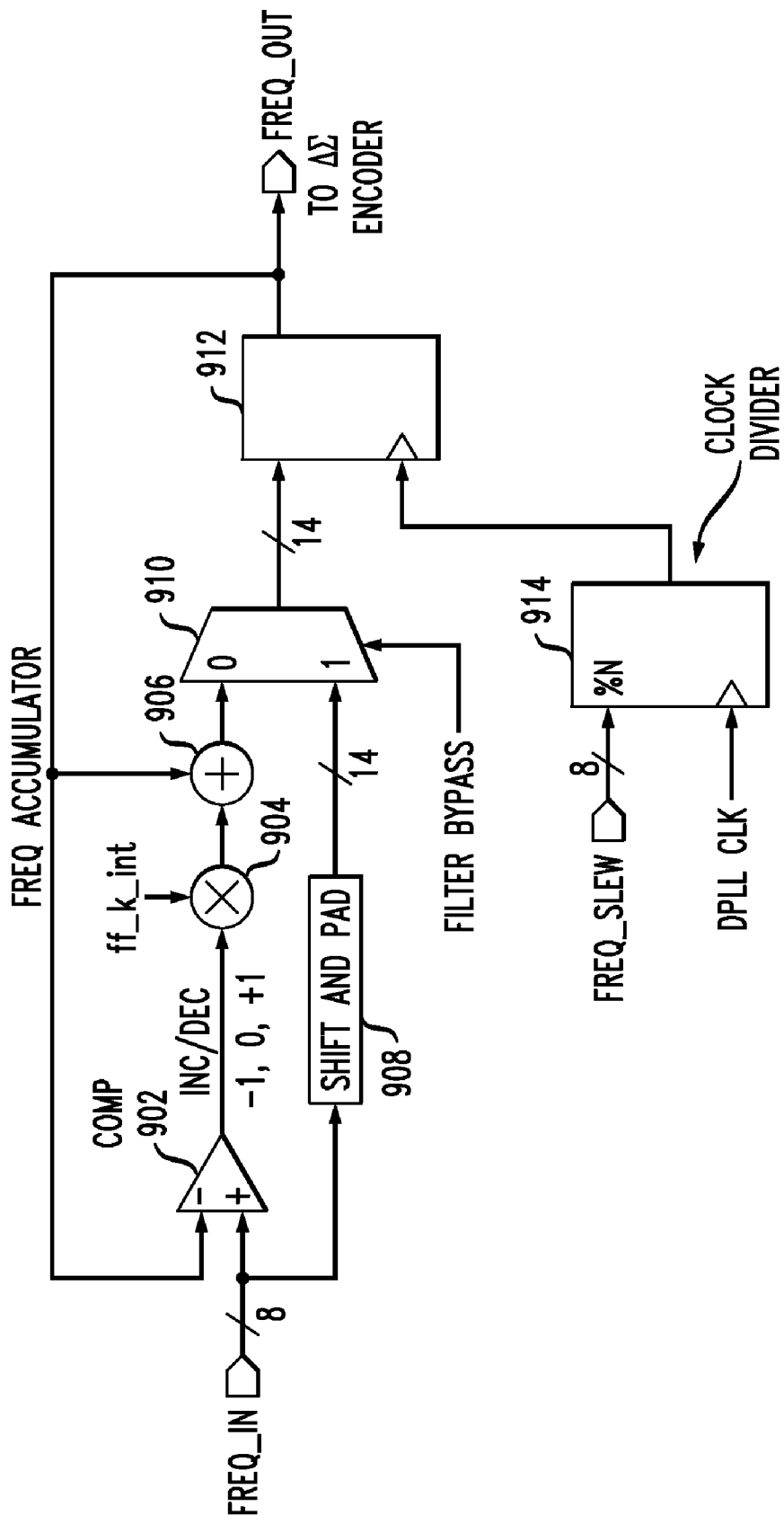
FIG. 9 illustrates a multiplier filter according to an embodiment of the invention.

The output frequency of the DPLL 702 can be changed on the fly by programming a new frequency multiplier in the feedback divider (via 722, 724 and 726 in FIG. 7). This programming can be done either by jumping directly to the new multiplier, and letting the DPLL relock to the new frequency, or by letting the multiplier filter (726) generate a multiplier ramp with a controlled, programmable slew rate, using the multiplier filter 900 shown in FIG. 9. As shown, the Freq_in input is compared in comparator 902 with the value contained in latch 912. As long as, for example, Freq_in is smaller than the content of 912, this content is increased by ff_k_int in each clock cycle, thus generating a linear sequence of values on latch 912. This is accomplished via multiplier 904, adder 906, shift and pad control 908, and selector 910, as configured in FIG. 9. The frequency at which latch 912 is clocked is controlled by a programmable divider controlled by input ff_slewrate, and so we control how fast the content of latch 912 moves towards ff_freqin.

When a new multiplier is programmed into the filter, a linear sequence of multipliers is generated by incrementing or decrementing an internal accumulator until this accumulator matches the input frequency. The rate at which this happens is regulated by dividing down the feedback clock, which stays frequency locked to the reference due to the "Faster" signals coming from the PFD. This ramp limits the power supply voltage drop caused by di/dt. It should be noted that during a frequency ramp, the DCO never generates a short cycle, or needs to skip one. Frequency can be changed continuously without halting the processor core.

As will be appreciated by one skilled in the art, aspects of the present invention may be embodied as a system, apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring again to FIGS. 1 through 9, the diagrams in the figures illustrate the architecture, functionality, and operation of possible implementations of systems, methods and computer program products according to various embodiments of the present invention. In this regard, each block in a flowchart or a block diagram may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagram and/or flowchart illustration, and combinations of blocks in the block diagram and/or flowchart illustration, can be implemented by special purpose hardware-based systems that perform the specified functions or acts, or combinations of special purpose hardware and computer instructions.

Accordingly, techniques of the invention, for example, as depicted in FIGS. 1-9, can also include, as described herein, providing a system, wherein the system includes distinct modules to perform the steps described and illustrated in the context of FIGS. 1-9. One or more embodiments can make use of software running on one or more general purpose computers or workstations.

It is also to be understood that the PFD and other PLL methodologies and components of the invention, as illustratively described herein, may be implemented as one or more integrated circuits (ICs) associated with a multi-core processor device or system which includes multiple processing elements (PEs) each with a local store (memory). Although not shown, the system may have its own display (or other data output device) and keyboard (or other data input device).

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. Apparatus, comprising:
   a first circuit for receiving first and second clock signals and for generating at least one signal indicative of a phase difference between the first and second clock signals; and
   a second circuit for receiving the at least one signal generated by the first circuit and, in response to the at least one received signal, generating at least one output signal, wherein a frequency associated with the at least one output signal is proportional to a frequency difference between the first and second clock signals.

2. The apparatus of claim 1, wherein the at least one output signal comprises a stream of pulses.

3. The apparatus of claim 2, wherein a frequency between two pulses of the stream of pulses is proportional to the frequency difference between the first and second clock signals.

4. The apparatus of claim 1, wherein the first and second clock signals are periodic signals.

5. The apparatus of claim 1, wherein the first circuit comprises a first edge-detector latch for receiving the first clock signal and generating the at least one signal indicative of the phase difference between the first and second clock signals when the first clock signal is ahead in phase with respect to the second clock signal.

6. The apparatus of claim 5, wherein the first circuit comprises a second edge-detector latch for receiving the second clock signal and generating the at least one signal indicative of the phase difference between the first and second clock signals when the second clock signal is ahead in phase with respect to the first clock signal.

7. The apparatus of claim 6, wherein the second circuit comprises a first output latch for receiving the at least one signal from the first edge-detector latch and for generating the at least one output signal when the first clock signal is ahead in phase with respect to the second clock signal.

8. The apparatus of claim 7, wherein the at least one output signal comprises a pulse for each edge of the first clock signal that the first clock signal gains a cycle with respect to the second clock signal.

9. The apparatus of claim 8, wherein the edge on which the pulse is generated is a rising edge of the first clock signal.

10. The apparatus of claim 7, wherein the second circuit comprises a second output latch for receiving the at least one signal from the second edge-detector latch and for generating the at least one output signal when the second clock signal is ahead in phase with respect to the first clock signal.

11. The apparatus of claim 10, wherein the at least one output signal comprises a pulse for each edge of the second clock signal that the second clock signal gains a cycle with respect to the first clock signal.

12. The apparatus of claim 11, wherein the edge on which the pulse is generated is a rising edge of the second clock signal.

13. The apparatus of claim 10, wherein the first output latch is controlled by the first clock signal and the second output latch is controlled by the second clock signal.

14. The apparatus of claim 10, wherein the first output latch and the second output latch are controlled by one of the first clock signal and the second clock signal.

15. The apparatus of claim 1, wherein the at least one output signal is used to affect a response of a loop filter of a digital phase locked loop.

16. The apparatus of claim 15, wherein a stream of pulses of the at least one output signal is converted into an accumulated number associated with the loop filter of the digital phase locked loop.

17. The apparatus of claim 1, wherein the at least one output signal is used to affect a response of a charge pump of an analog phase locked loop.

18. The apparatus of claim 17, wherein a stream of pulses of the at least one output signal is converted into a voltage associated with the charge pump of the analog phase locked loop.

19. A method, comprising:
   receiving, at a first circuit, first and second clock signals;
   generating, at the first circuit, at least one signal indicative of a phase difference between the first and second clock signals;
   receiving, at a second circuit, the at least one signal generated by the first circuit; and
   in response to the at least one received signal, generating, at the second circuit, at least one output signal, wherein a frequency associated with the at least one output signal is proportional to a frequency difference between the first and second clock signals.

20. The method of claim 19, wherein the at least one output signal comprises a stream of pulses.

21. The method of claim 20, wherein a frequency between two pulses of the stream of pulses is proportional to the frequency difference between the first and second clock signals.

22. The method of claim 19, wherein the first and second clock signals are periodic signals.

23. A phase and frequency detector, comprising:
   a first circuit for receiving first and second clock signals and for generating at least one signal indicative of a phase difference between the first and second clock signals; and
   a second circuit for receiving the at least one signal generated by the first circuit and, in response to the at least one received signal, generating at least one output signal, wherein a frequency associated with the at least one output signal is proportional to a frequency difference between the first and second clock signals.

24. The detector of claim 23, wherein the at least one output signal is used to affect a response of a phased lock loop.

25. The detector of claim 24, wherein the phase locked loop is one of a digital phase locked loop and an analog phase locked loop.

* * * * *